United States Patent
Sun et al.

(10) Patent No.: US 7,348,516 B2
(45) Date of Patent: Mar. 25, 2008

(54) METHODS OF AND LASER SYSTEMS FOR LINK PROCESSING USING LASER PULSES WITH SPECIALLY TAILORED POWER PROFILES

(75) Inventors: Yunlong Sun, Beaverton, OR (US); Richard Harris, Portland, OR (US); Ho Wai Lo, Portland, OR (US); Brian Baird, Oregon City, OR (US); Jay Johnson, Portland, OR (US); Robert F. Hainsey, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/921,481

(22) Filed: Aug. 18, 2004

(65) Prior Publication Data

US 2005/0067388 A1 Mar. 31, 2005

Related U.S. Application Data

(60) Provisional application No. 60/496,631, filed on Aug. 19, 2003.

(51) Int. Cl.
*B23K 26/00* (2006.01)
*B23K 26/14* (2006.01)
*B23K 26/16* (2006.01)

(52) U.S. Cl. ............ 219/121.61; 219/121.68; 219/121.67; 219/121.69; 219/121.85

(58) Field of Classification Search ........ 219/121.61, 219/121.68, 121.67, 121.69, 121.85
See application file for complete search history.

(56) References Cited

U.S. PATENT DOCUMENTS

| | | | |
|---|---|---|---|
| 3,747,019 A | 7/1973 | Koechner et al. | 372/30 |
| 3,879,686 A | 4/1975 | Milam et al. | 331/94.5 M |
| 4,483,005 A | 11/1984 | Smart | 372/25 |
| 5,265,114 A | 11/1993 | Sun et al. | 372/69 |
| 5,307,369 A | 4/1994 | Kimberlin | 372/108 |
| 5,319,195 A | 6/1994 | Jones et al. | 250/227.11 |
| 5,339,764 A | 8/1994 | Singbartl | 372/57 |
| 5,473,624 A | 12/1995 | Sun | 372/69 |

(Continued)

FOREIGN PATENT DOCUMENTS

EP 1 422 796 A2 5/2004

(Continued)

OTHER PUBLICATIONS

WO 2004/107510 A2, Dec. 2004, WIPO, Oron et al.

*Primary Examiner*—M. Alexandra Elve
(74) *Attorney, Agent, or Firm*—Stoel Rives LLP

(57) ABSTRACT

A laser pulse with a specially tailored temporal power profile, instead of a conventional temporal shape or substantially square shape, severs an IC link. The specially tailored laser pulse preferably has either an overshoot at the beginning of the laser pulse or a spike peak within the duration of the laser pulse. The timing of the spike peak is preferably set ahead of the time when the link is mostly removed. A specially tailored laser pulse power profile allows the use of a wider laser pulse energy range and shorter laser wavelengths, such as the green and UV, to sever the links without appreciable damage to the substrate and passivation structure material located on either side of and underlying the links.

37 Claims, 8 Drawing Sheets

U.S. PATENT DOCUMENTS

| | | | |
|---|---|---|---|
| 5,756,924 A | 5/1998 | Early | 102/201 |
| 5,998,759 A | 12/1999 | Smart | 219/121.69 |
| 6,025,256 A | 2/2000 | Swenson et al. | 438/601 |
| 6,057,180 A | 5/2000 | Sun et al. | 438/132 |
| 6,169,014 B1 | 1/2001 | McCulloch | 438/487 |
| 6,210,401 B1 | 4/2001 | Lai | 606/12 |
| 6,252,195 B1 | 6/2001 | Mosavi et al. | 219/121.69 |
| 6,281,471 B1 | 8/2001 | Smart | 219/121.62 |
| 6,339,604 B1 | 1/2002 | Smart | 372/26 |
| 6,340,806 B1 | 1/2002 | Smart et al. | 219/121.62 |
| 6,346,686 B1 | 2/2002 | Betin et al. | 219/121.61 |
| 6,433,306 B1 * | 8/2002 | Grubb et al. | 219/121.73 |
| 6,462,307 B1 * | 10/2002 | Hennig et al. | 219/121.77 |
| 6,541,731 B2 | 4/2003 | Mead et al. | 219/121.7 |
| 6,574,250 B2 * | 6/2003 | Sun et al. | 372/25 |
| 6,703,582 B2 | 3/2004 | Smart et al. | 219/121.62 |
| 6,727,458 B2 | 4/2004 | Smart | 219/121.62 |
| 6,878,899 B2 | 4/2005 | Smart | 219/121.61 |
| 6,887,804 B2 | 5/2005 | Sun et al. | 438/940 |
| 2001/0050931 A1 | 12/2001 | Iso | 372/25 |
| 2002/0003130 A1 | 1/2002 | Sun et al. | 219/121.68 |
| 2002/0167581 A1 * | 11/2002 | Cordingley et al. | 347/173 |
| 2003/0151053 A1 | 8/2003 | Sun et al. | 257/79 |
| 2003/0222324 A1 | 12/2003 | Sun et al. | 257/431 |
| 2003/0222330 A1 | 12/2003 | Sun et al. | 257/665 |
| 2004/0134894 A1 | 7/2004 | Gu et al. | 219/121.68 |
| 2004/0134896 A1 | 7/2004 | Gu et al. | 219/121.69 |
| 2004/0188399 A1 | 9/2004 | Smart | 219/121.69 |
| 2005/0092720 A1 | 5/2005 | Gu et al. | 219/121.69 |
| 2005/0115936 A1 | 6/2005 | Gu et al. | 219/121.69 |
| 2005/0115937 A1 | 6/2005 | Gu et al. | 219/121.69 |
| 2005/0150879 A1 | 7/2005 | Gu et al. | 219/121.69 |
| 2005/0150880 A1 | 7/2005 | Gu et al. | 219/121.69 |

FOREIGN PATENT DOCUMENTS

WO    WO 2004/098003 A1    11/2004

* cited by examiner

METHODS OF AND LASER SYSTEMS FOR LINK PROCESSING USING LASER PULSES WITH SPECIALLY TAILORED POWER PROFILES

RELATED APPLICATION

This application claims benefit of U.S. Provisional Patent Application No. 60/496,631, filed Aug. 19, 2003.

COPYRIGHT NOTICE

2004 ©Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

The present invention relates to laser processing of conductive links on memory chips or other integrated circuit (IC) chips and, in particular, to laser methods and systems employing laser pulses having specially tailored power profiles for better processing quality and yield.

BACKGROUND OF THE INVENTION

Decreased yields in IC device fabrication processes often result from defects caused by misalignment of subsurface layers or patterns or by particulate contaminants. FIGS. 1, 2A, and 2B show repetitive electronic circuits 10 of an IC device or work piece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are designed to include between electrical contacts 24 laser severable conductive links 22 that can be removed to disconnect a defective memory cell 20, for example, and substitute a replacement redundant cell 26 in a memory device such as a DRAM, an SRAM, or an embedded memory. Similar techniques are also used to sever links 22 to repair CCD imaging devices or to program a logic product, gate arrays, or ASICs.

Links 22 in link structure 36 are about 0.3 micron (μm)-2 μm thick and are designed with conventional link widths 28 of about 0.4 μm-2.5 μm, link lengths 30 between adjacent electrical contacts 24, and element-to-element pitches (center-to-center spacings) 32 of about 2 μm-8 μm from adjacent circuit structures or elements 34. Although the most commonly used link materials have been polysilicon, polycide, and like compositions, memory manufacturers have more recently adopted a variety of more electrically conductive metallic link materials that may include, but are not limited to, aluminum, chromide, copper, gold, nickel, nickel chromide, titanium, tungsten, platinum, as well as other metals, metal alloys, metal nitrides such as titanium or tantalum nitride, metal silicides such as disilicide, tungsten silicide, or other metal-like materials.

Electronic circuits 10, circuit elements 14, or memory cells 20 are tested for defects, the locations of which may be mapped into a database or program. Traditional 1.047 μm or 1.064 μm infrared (IR) laser wavelengths have been employed for more than 20 years to explosively remove conductive links 22. Conventional memory link processing systems focus at a selected link 22 a single laser output pulse 37 having a pulse width of about 4 nanoseconds (ns) to 30 ns. FIGS. 2A and 2B show a laser spot 38 of spot size (area or diameter) 40 impinging a link structure 36 composed of a polysilicon or metal link 22 positioned above a silicon substrate 42 and between component layers of a passivation layer stack including an overlying passivation layer 44 (shown in FIG. 2A), which is typically 500 Å-10,000 Å (D) thick, and an underlying passivation layer 46. FIG. 2C shows two adjacent links 22 separated by an intermediate passivation layer 48. Each of links 22 has opposite side surfaces 52 separated by a distance that defines a nominal link width 28, which laser spot 38 encompasses to sever link 22. Silicon substrate 42 absorbs a relatively small proportional quantity of IR laser radiation, and conventional passivation layers 44, 46, and 48 such as silicon dioxide or silicon nitride are relatively transparent to IR laser radiation. The links 22 are typically processed "on-the-fly" such that the beam positioning system does not have to stop moving when a laser pulse is fired at a selected link 22, with each selected link 22 being processed by a single laser pulse. The on-the-fly process facilitates a very high link-processing throughput, such as processing several tens of thousands of links 22 per second.

FIG. 2D is a fragmentary cross-sectional side view of the link structure of FIG. 2B after removal of link 22 by the prior art laser pulse. To avoid damage to the substrate 42 while maintaining sufficient laser energy to process a metal or nonmetal link 22, Sun et al. in U.S. Pat. Nos. 5,265,114 and 5,473,624 describe using a single 9 ns to 25 ns laser pulse at a longer laser wavelength, such as 1.3 μm, to process memory links 22 on silicon wafers. At the 1.3 μm wavelength, the laser energy absorption contrast between the link material 22 and silicon substrate 42 is much larger than that at the traditional 1 μm laser wavelengths. The much wider laser processing window and better processing quality afforded by this technique has been used in the industry for about five years with great success.

However, ever-shrinking link dimensions and link-to-link pitch sizes demand a smaller laser beam spot size. A shorter laser wavelength is thus preferred for delivering a smaller laser beam spot size. A shorter laser wavelength than the 1 μm and 1.3 μm will also deliver a better coupling of the laser energy into the link target material to facilitate the process.

U.S. Pat. No. 6,057,180 of Sun et al. describes a method of using ultraviolet (UV) laser output to sever links with the benefit of a smaller beam spot size. However, removal of the link itself by such a UV laser pulse entails careful consideration of the underlying passivation structure and material to protect the underlying passivation and silicon wafer from damage by the UV laser pulse.

U.S. Pat. No. 6,025,256 of Swenson et al. describes methods of using ultraviolet (UV) laser output to expose or ablate an etch protection layer, such as a resist or photoresist, coated over a link that may also have an overlying passivation material, to permit link removal (and removal of the overlying passivation material) by different material removal mechanisms, such as by chemical etching. This process enables the use of an even smaller beam spot size. However, expose and etch removal techniques employ additional coating, developing, and/or etching steps, which typically entail sending the wafer back to the front end of the manufacturing process for one or more extra steps.

FIG. 3A is the typical temporal shape of a traditional laser pulse at wavelengths of 1 μm and 1.3 μm used in the link processing. To more effectively use the laser energy, Smart et al. in U.S. Pat. Nos. 6,281,471 and 6,340,806 propose using laser pulses of temporal shape shown in FIG. 3B with substantially square temporal power density distributions to process the links. According to Smart et al., the rise time of the laser pulse has to be shorter than 1 ns, the flatness of the squared wave top has to be better than 10%, and the fall time has to be sufficiently short. The stated advantage of using laser pulses with the temporal shape shown in FIG. 3B was that the sharp rise time of the laser pulse would deliver thermal shock to the overlying layer of oxides and thereby facilitate the link blowing process. In addition, the reflectivity of the laser energy by the link at the higher power density would be reduced with the fast rising, short duration pulse. If, however, breaking the overlying passivation layer sooner with the help of a thermal shock wave delivered to the layer by the sharp rise time of the laser pulse truly facilitates the process, processing link structures with no overlying passivation layer would not have been a technical challenge. Industry practice has proved otherwise.

Because of inevitable variations of the link structure, such as, for example, the thickness of the overlying passivation layer; the thickness, width, and side wall slope of the link itself; and the thickness of the underlying passivation layer, there is a need for some head room in the laser pulse energy used to process the links. Typically, the link material will be totally removed well before of the laser pulse ends. Preferably, for the typical laser pulse used, the link material is totally removed by time $t_1$, as shown in FIG. 3A. Similarly, time $t_1$ in FIG. 3B depicts the time when the typical link material is totally removed. Persons skilled in the art will realize that the laser pulse energy after time $t_1$ for both cases imposes a great risk of damaging the silicon substrate because there would be no link material remaining to shield the substrate from exposure to the laser energy. The laser pulse energy after time $t_1$ imposes great risk of damaging also the neighboring structure to the link. Unfortunately, for the traditional laser pulse, there is no control over the temporal shape of the laser pulse after time $t_1$. For the substantially square temporal laser pulse, it is worse in that right after the time $t_1$ the laser pulse will remain at its peak intensity for a while, causing even greater risk of damage to the substrate or neighboring structure.

What is needed, therefore, is a better way of controlling the temporal power profile of the laser pulse to facilitate better link process quality and yield.

SUMMARY OF THE INVENTION

An object of the present invention is to provide a method of and an apparatus for improving the processing quality of removal of IC link and overlying passivation structure material fabricated on a substrate.

Another object of the invention is to process a link with a specially tailored temporal laser pulse power profile to achieve improved process quality and a wider process window.

A further object of the invention is to provide a method of and an apparatus for employing a smaller laser beam spot size for link removal techniques with a shorter laser wavelength without appreciable damage to the substrate and side and underlying passivation structure material surrounding the link being removed.

The present invention employs a laser pulse with a specially tailored temporal power profile to sever an IC link, instead of using a laser pulse of conventional temporal shape or substantially square shape. The specially tailored laser pulse preferably has either an overshoot at the beginning of the laser pulse or a "spike peak" within the duration of the laser pulse. The power amplitude of the overshoot or the spike peak during the pulse is more than about 10%, preferably 10% to 50%, over the average power amplitude of the laser pulse. The temporal width of the overshoot or the spike peak is between about 1 ns and about 50% of the duration of the laser pulse, and preferably between about 10% and about 50% of the duration of the laser pulse. The timing of the spike is preferably set ahead of the time when the link is totally removed, considering all the realistic variations of the link structure and laser parameters during manufacturing. Other techniques of modulating the laser pulse temporal power profile can be used, such as multiple leading edge overshoots, multiple spike peaks, or oscillating peak power amplitude, based on different link structures. The duration of the laser pulse is preferably between about 1 ns and about 40 ns. The falling edge of the laser pulse temporal power profile is typically shorter than about 10 ns. The energy of the laser pulse is preferably between about 0.001 microjoule (µJ) and about 10 µJ.

The specially tailored laser pulse power profile allows the use of a wider laser pulse energy range and shorter laser wavelengths, such as green and UV to generate an opening in the overlying passivation layer and sever the links. The opening is sufficiently wide to accomplish severing the link but sufficiently narrow to not appreciably damage any neighboring structures. The technique does not appreciably damage the substrate and the passivation structure material located on either side of and underlying the link as well.

In one embodiment, two temporally displaced laser pulses propagating from two lasers can be combined with a programmable delay time between the two laser pulses. A first laser pulse propagating from a first laser preferably has a narrower pulse width than that of a second laser pulse propagating from a second laser. Different delay times establish for each combined laser pulse an overshoot or a spike occurring at a different part of the combined temporal profile.

In another embodiment, an extra-cavity gate device, such as an electro-optical Pockels cell (E-O) device and a polarizer, is employed to shape the laser pulse emitted from a laser source. The E-O device, controlled by the drive voltage applied to it, can "gate" a part of laser pulse out from a different part of the laser pulse with a desired pulse width, rise and fall times, and a tailored shape.

In a further embodiment, a laser output pulse emitted from a diode laser is injected into a power amplifier. The temporal power profile of the laser pulse emitted from the diode laser is specially tailored by controlling its driver. The power amplifier operates in an unsaturated state to provide an amplified laser output pulse that substantially replicates the specially tailored temporal power profile of the injected laser pulse and to deliver adequate laser energy within the pulse for the link processing applications. Persons skilled in the art will appreciate that they could readily accomplish tailoring of the temporal current profile of the drive pulse from the diode laser driver to generate the laser pulse emitted from the diode laser characterized by the specially tailored power profile preferred for the link process application.

Additional objects and advantages of this invention will be apparent from the following detailed description of preferred embodiments, which proceeds with reference to the accompanying drawings.

DETAILED DESCRIPTION OF PREFERRED EMBODIMENTS

Figure 3E:
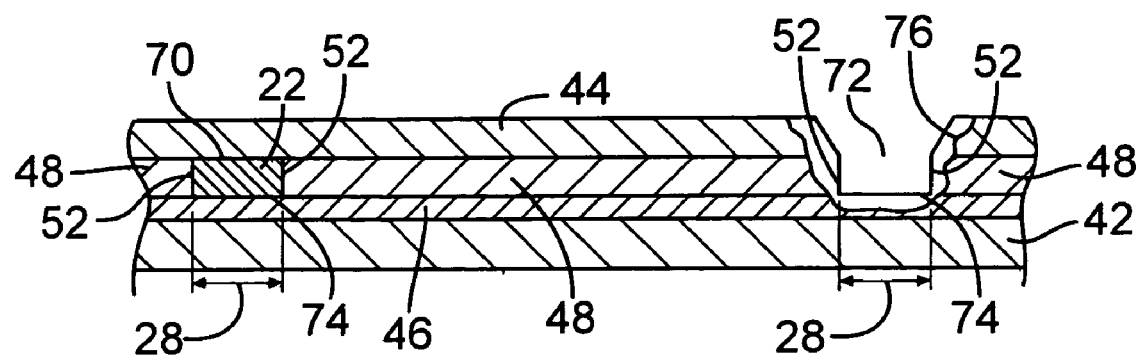
FIG. 3E is a fragmentary cross-sectional view of the link structure of FIG. 2C after link removal by application of a laser pulse having a pulse power profile specially tailored in accordance with the present invention.
Figure 3A:
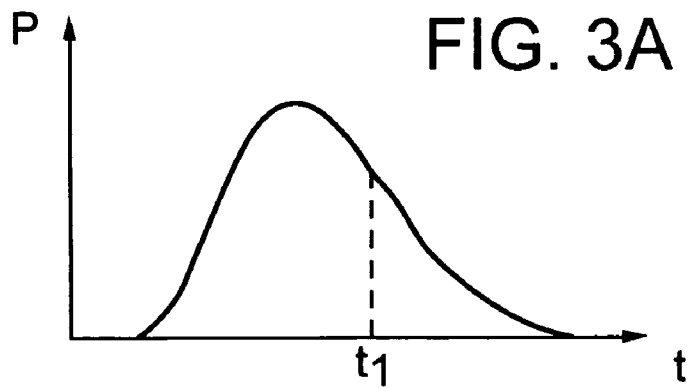
FIGS. 3A, 3B, 3C, and 3D show, respectively, conventional, substantially square-shaped, rising edge overshoot specially tailored, and spike peak specially tailored laser pulse temporal power profiles.
Figure 3B:
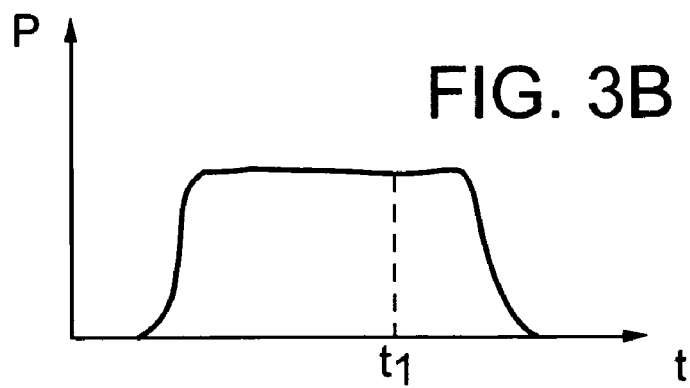
Figure 3C:
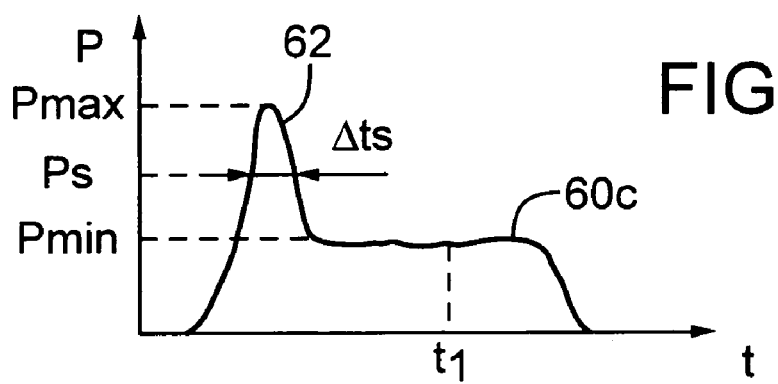
Figure 3D:
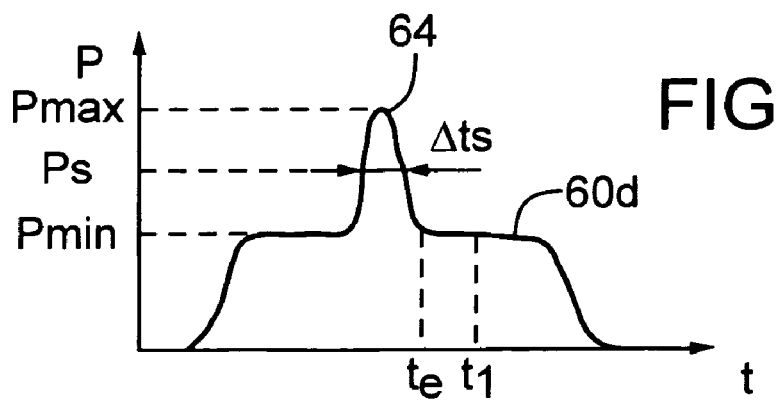

FIGS. 3A and 3B show, respectively, the traditional laser pulse power profile and substantially square laser pulse profile used in the prior art. FIG. 3C shows one embodiment of the invention that employs a specially tailored laser pulse power profile 60c with a significant overshoot or "spike" 62 appearing at the beginning of the laser pulse. The peak power of the overshoot is Pmax, and the average power of the laser pulse is Pmin. The amplitude of the overshoot is defined as Pmax-Pmin. The width of the overshoot or "spike," Δts, is defined as the full duration time at the middle power point, Ps, between Pmax and Pmin. The peak power of the overshoot or the "spike," Pmax, is preferably about 10% to about 50% over the average power of the laser pulse, Pmin. The width of the overshoot or "spike", Δts, is preferably 10% to 50% of the duration of the laser pulse. The rise time of the spike is typically shorter than about 5 ns, and preferably shorter than about 2 ns. FIG. 3D shows another embodiment of the invention that employs a power profile 60d with an overshoot or "spike" 64 appearing not at the beginning of but during the laser pulse. The overshoot or "spike" ends at time, $t_e$, which is before the time, $t_1$, when the link material is totally removed by the laser energy. For purposes of convenience, the term "spike" is used throughout the remainder of the application to indicate a significant, transient increase in laser power, irrespective of when it occurs during the laser pulse.

FIG. 3E shows the conditions of the passivation layers after link 22 has been removed by a laser with laser pulse power profile 60c or 60d. Passivation layer 44 overlaying a top surface 70 of link 22 has an opening 72 that extends beyond width 28 of link 22 by a relatively small amount, e.g., about the thickness of overlying passivation layer 44. Intermediate passivation layer 48 material positioned adjacent side surfaces 52 of link 22, passivation layer 46 underlying a bottom surface 74 of link 22, and substrate 42 are not appreciably damaged. FIG. 3E shows an irregularly curved line 76 passing through portions of passivation layers 44, 46, and 48 surrounding the open area previously occupied by removed link 22. Curved line 76 represents typical damage to the passivation structure, specifically damage that extends by a certain amount, e.g., about 0.5 micron, from the region previously occupied by the link or becomes quite visible under a microscope. Typical damage also includes cracks in the passivation structure, which are not shown in the drawing figures.

FIGS. 4-6 show several preferred embodiments implementing laser pulse power profile tailoring and their associated specially tailored laser pulse power profiles employed to sever links 22 in accordance with the present invention. Depending on the wavelength of laser output and the characteristics of the link material, tailoring of the power profile of a laser pulse provides it with sufficient peak power and energy of the pulse and proper duration to sever the link. After completion of link material removal, the power profile and remaining duration of the laser pulse are tailored to impose no risk of damage to the substrate and neighboring structure of the link undergoing the process, even if the laser wavelength used is shorter than 1.3 μm, in the visible range, or in the UV range.

Preferably, each laser pulse 37 severs a single link 22. (Unless otherwise indicated, the references to laser pulse 37 and focused spot size 40 (both shown in FIG. 2A) in connection with the descriptions of preferred embodiments relate to emission of laser pulses and not to prior art power profiles associated with them). At a preferred wavelength from about 250 nm to about 2000 nm, preferred ablation parameters of focused spot size 40 of laser pulses 37 include laser energies of each laser pulse of between about 0.005 μJ and about 10 μJ, the duration of each laser pulse 37 is preferably shorter than about 40 ns and longer than about 1 ns, laser pulse repetition rate is greater than 1 Hz, more preferably within 10 KHz and 60 KHz or higher and may be a function of the speed of the positioning system 380 (FIG. 7) and the distance between adjacent links 22 to be processed. The focused laser spot diameter is within the range of between about 0.5 μm and about 3 μm and preferably is about 40% to about 100% larger than the width of link 22, depending on link width 28, link pitch size 32, link material, and other link structure and process considerations.

With reference to FIGS. 3C and 3D, the laser pulse power profiles 60c and 60d, respectively, can be specially tailored to have a significant leading edge overshoot 62 (FIG. 3C) at the beginning of the laser pulse or have one or two mid-pulse spikes 64 (one spike shown in FIG. 3D) sometime within the duration of the laser pulse, before the link material is totally removed. Preferred timing of the power spike is within an interval measured from the rising edge of the laser pulse power profile to 70% of the duration of the laser pulse power profile. FIG. 3D shows laser pulse power profile 60d in which the power level is relatively flat before and after pulse spike 64. The laser pulse power profile can have a changing power level before and after pulse spike 64. Tailoring the laser pulse power profile in this manner provides from leading edge overshoot or mid-pulse spikes sufficient laser peak power and energy to facilitate the satisfactory removal of the link material and, upon removal of most of the link material, much lower laser pulse power to remove remaining link material and ensure reduced risk of damage to the silicon substrate and to the structure neighboring the link. As a result, such special tailoring of the laser power profile delivers much better processing results and a wider process window and reduces risk of damage to the silicon substrate and to the structure neighboring the link.

Figure 4A:
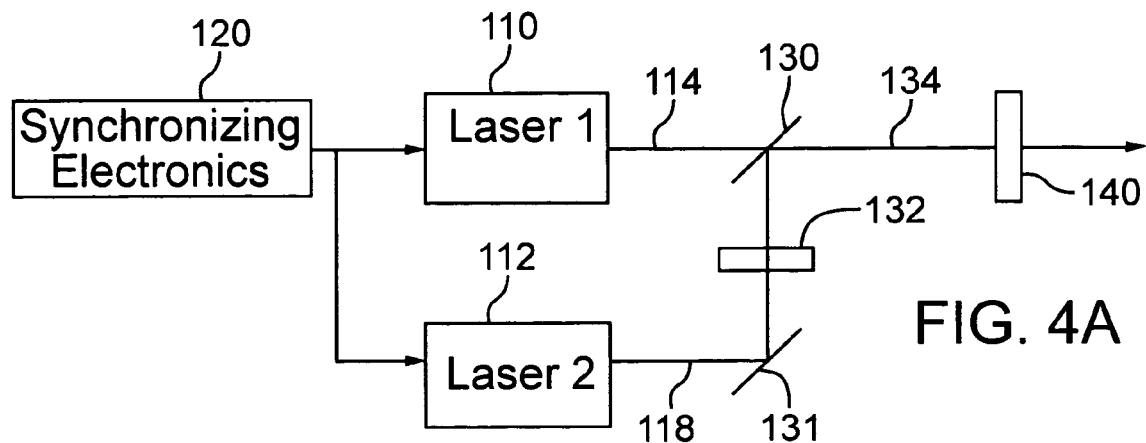
FIG. 4A shows a first preferred embodiment of the present invention in which laser pulses combined from first and second different lasers generate a laser pulse with a specially tailored temporal power profile.
Figure 4B:
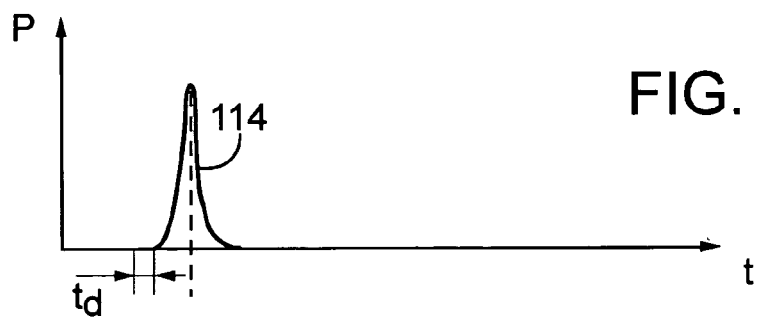
FIGS. 4B, 4C, and 4D show for the embodiment of FIG. 4A laser pulse temporal power profiles of, respectively, the first laser, the second laser, and a combination of the first and second lasers configured for link processing.
Figure 4C:
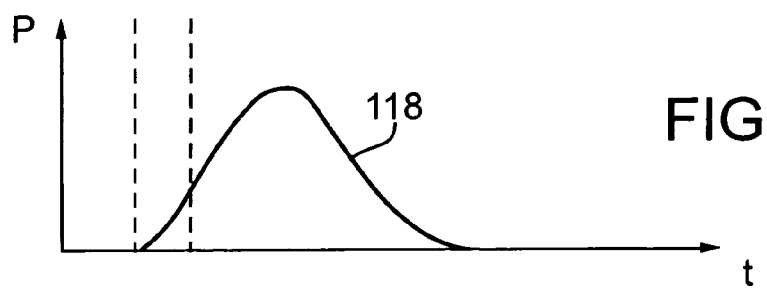
Figure 4D:
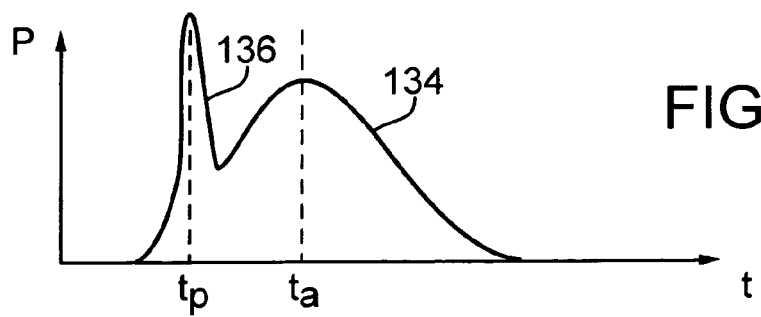

With reference to FIG. 4A, in a first embodiment, special tailoring of the laser pulse power profile is accomplished by combining two laser pulses from two separate laser rails 110 and 112. Laser rail 110 generates a shorter laser pulse 114, shown in FIG. 4B, and laser rail 112 generates a longer laser pulse 118, shown in FIG. 4C. The synchronization of or delay time ($t_d$) between laser pulses 114 and 118 is controlled by synchronizing electronics 120. Laser pulses 114 and 118 are combined by a beam combiner 130 after laser pulse 118 reflects off a mirror 131 and propagates through a waveplate 132 for polarization control purposes. FIG. 4D shows a combined laser pulse 134 that has a final power profile with a significant power spike 136 preferred for link processing. The total laser pulse width of combined laser pulse 134 can be either the sum of the widths of laser pulses 114 and 118 or the width of laser pulse 118, depending on the delay time between laser pulses 114 and 118. The widths of laser pulses 114 and 118 can be optimized for the link processing based on the link structure. Combined laser pulse 134 can be configured such that an additional power spike occurs at, for example, $t_a$, after power spike 136. The additional power spike would preferably have a power value that is more than 5% of the average power of the combined laser pulse 134.

The timing of the spike 136 at time $t_p$ can also be readily program controlled by synchronizing electronics 120 for the best link processing quality and yield. Skilled persons in the art will appreciate that, because they propagate from different laser rails and travel along different beam paths before combination by beam combiner 130, laser pulses 114 and 118 can be manipulated to have different beam spot sizes to further facilitate the link processing.

Typically, after beam combiner 130 combines laser pulses 114 and 118, their polarization states are different from their original polarization states. For instance, the energy of laser pulse 114 can be vertically polarized while the energy of laser pulse 118 can be horizontally polarized. With the combined laser energy polarization states, the orientation of the target link or wafer mounted on a system worktable can be changed accordingly for the best processing quality and yield. An optional waveplate 140 can be inserted along the propagation path of combined laser pulse 134 so that all of the laser energy is circularly polarized, if such a configuration delivers a better processing quality and yield for a particular link structure.

Figure 5A:
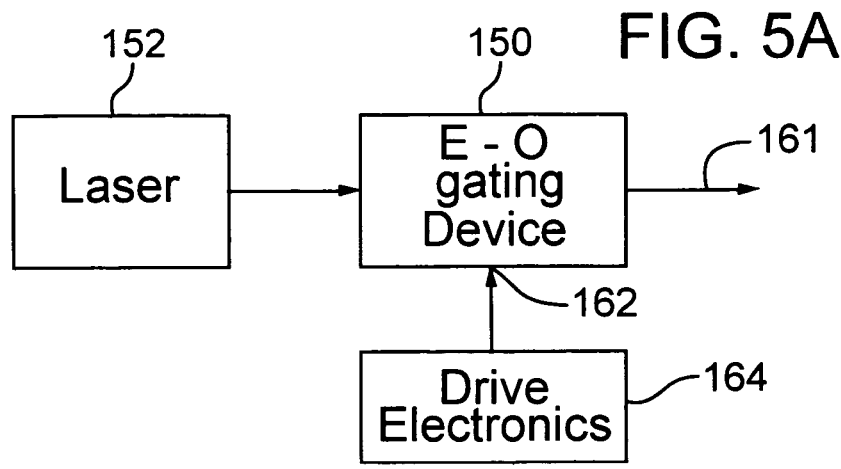
FIG. 5A shows a second preferred embodiment of the present invention in which a pulsed laser is followed by an E-O gating device.
Figure 5B:
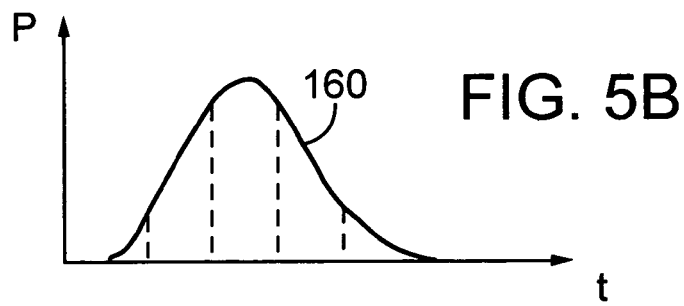
FIG. 5B shows the laser temporal power profile of the laser pulse emitted from the laser rail.
Figure 5C:
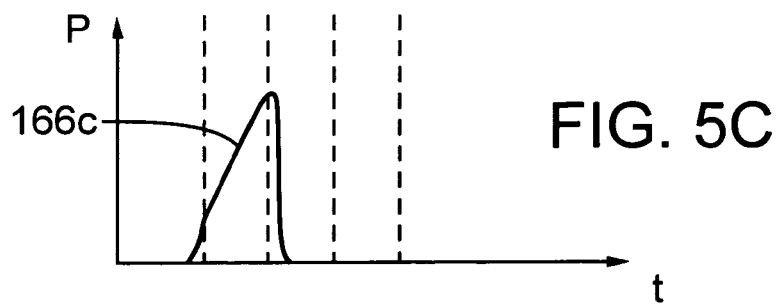
FIGS. 5C and 5D show different laser pulse temporal power profiles produced at the E-O gating device output for different gating delay times.
Figure 5D:
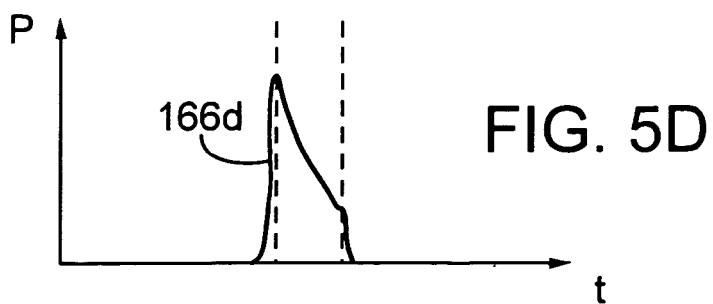

With reference to FIG. 5A, in a second embodiment, an E-O gating device 150 shapes the power profile of laser pulses propagating from a diode-pumped, Q-switched solid state laser 152. Laser 152 delivers multiple laser pulses 160 (one shown in Fig, 5B), each with a relatively long laser pulse width at full width, half maximum (FWHM). The FWHM pulse width can be, for example, about 30ns to 50ns. Laser pulses 160 propagate through E-O gating device 150. The output laser pulse power profile depends on the width and shape of a drive voltage pulse 162 delivered from drive electronics 164 and the delay time between laser pulse 160 and the drive voltage pulse 162 applied to E-O device 150. The output laser pulse can have an upwardly, substantially linearly inclined (increasing) power profile, as shown for laser pulse 166c in FIG. 5C or a downwardly, substantially exponentially decreasing power profile with a higher peak at the very beginning of the laser pulse, as shown for laser pulse 166d in FIG. 5D. The total power decline after the peak is more than about 10% of the average power of the laser output pulse. Persons skilled in the art will appreciate that the width and shape of the voltage pulse itself applied to E-O device 150 can be tailored to provide greater flexibility in tailoring the width and power profile of laser pulse 166.

Figure 6A:
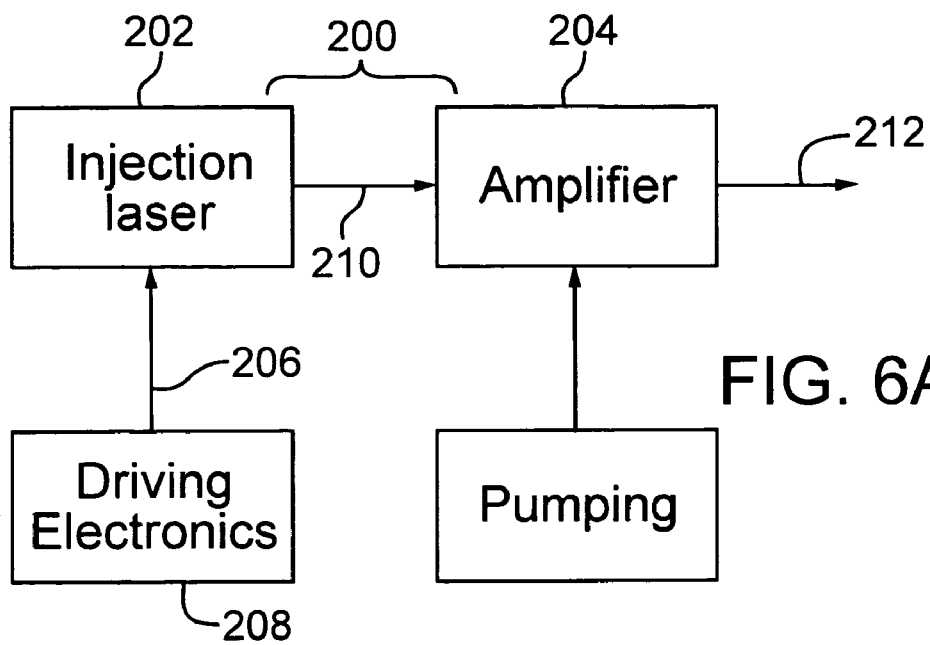
FIG. 6A shows a third preferred embodiment of the present invention using an injection laser followed by an amplifier operating in an unsaturated state so it amplifies without distortion the injection laser pulse to an energy level required for the link processing.
Figure 6B:
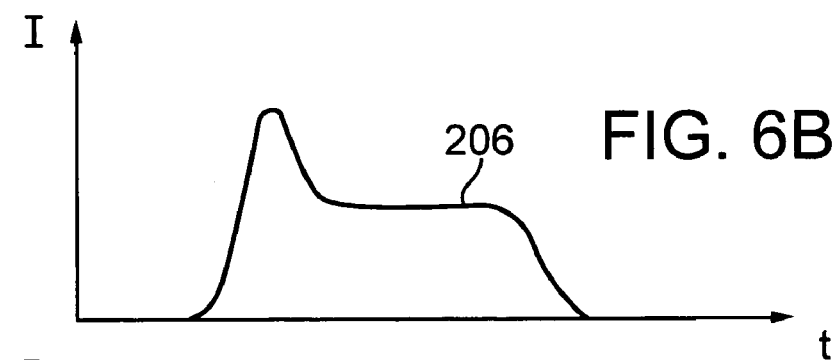
FIGS. 6B, 6C, and 6D show for one implementation of the embodiment of FIG. 6A, respectively, the injection laser drive current waveform, the resultant injection laser pulse power profile, and an amplified laser pulse power profile replicating that of the injection laser pulse.
Figure 6C:
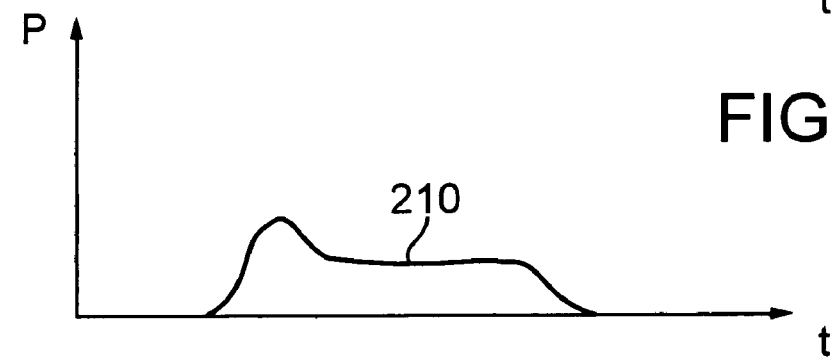
Figure 6D:
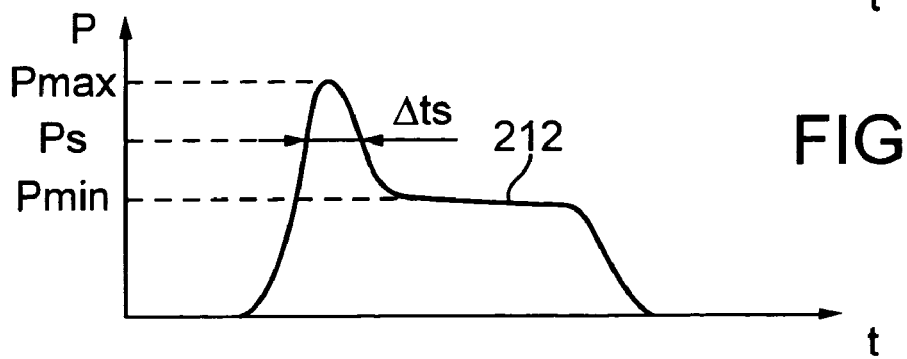

With reference to FIG. 6A, in a third embodiment, a laser 200 is composed of an injection laser 202 followed by an amplifier 204. Injection laser 202 can be a diode laser having a fast response time and delivering laser output at a laser wavelength that matches the gain spectrum of amplifier 204. FIG. 6B shows a specially tailored drive current pulse 206 delivered from driving electronics 208, and FIG. 6C shows that an injection laser output pulse 210 propagating from injection laser 202 replicates the profile of drive current pulse 206 as a result of the fast response capability of injection laser 202. Injection laser output pulse 210 is delivered to laser power amplifier 204, which is operating in an unsaturated state to amplify injection laser output pulse 210 and deliver an output pulse 212 without introducing significant distortion of the tailored laser pulse power profile, as shown in FIG. 6D. Output pulse 212 is relatively flat after the occurrence of the power spike and before the falling edge of the laser pulse temporal power profile. Persons skilled in the art will appreciate that the profile of drive current pulse 206 can be readily programmed to any preferred profile in accordance with this invention. Persons skilled in the art will also appreciate that the gain requirement of amplifier 204 depends on the laser pulse power available from injection laser 202 and the power of the laser output pulse 212 required for this invention.

Figure 6E:
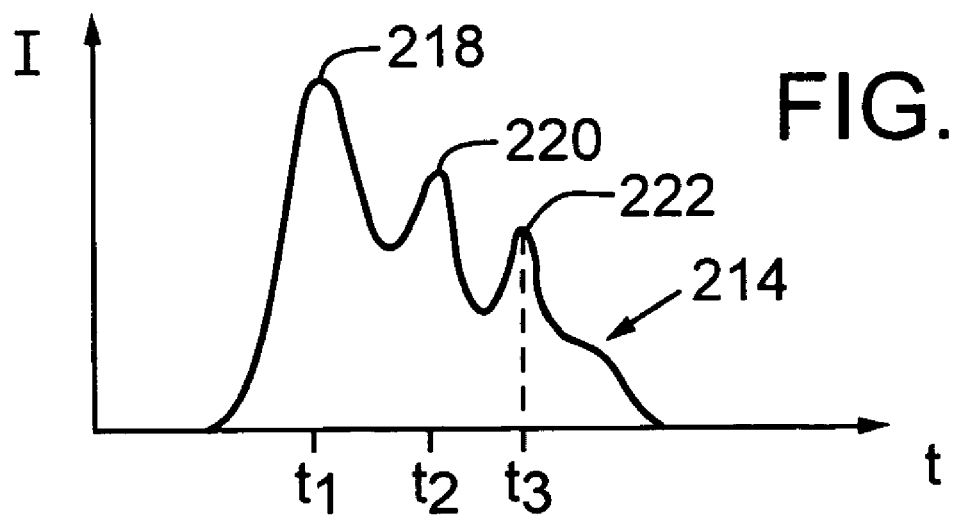
FIGS. 6E and 6F show for another implementation of the embodiment of FIG. 6A, respectively, the injection laser drive current waveform and the resultant injection laser pulse power profile.
Figure 6F:
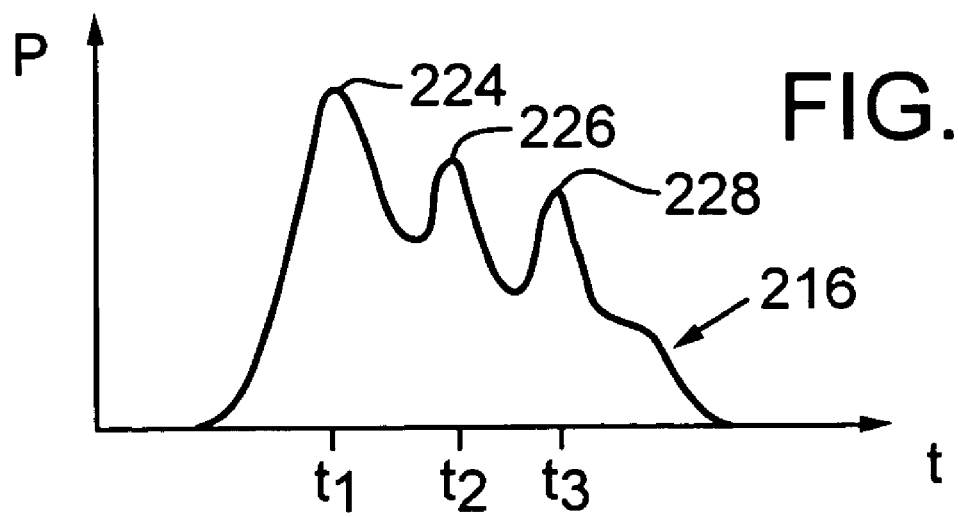

FIGS. 6E and 6F show, respectively, a drive current profile 214 and its replicated laser pulse power profile 216 produced in accordance with a different implementation of the third embodiment of FIG. 6A. Drive current profile 214 is composed of a pulse with three time-displaced current spikes 218, 220, and 222 of decreasing values over time at $t_1$, $t_2$, $t_3$, respectively. Current spikes 218, 220, and 222 produce for laser pulse power profile 216 corresponding power spikes 224, 226, and 228. Power spike 224 represents an overshoot occurring at the rising edge of laser pulse power profile 216, and power spikes 226 and 228 represent subsequent power spikes occurring during the pulse but before the target link material is completely removed. Power spikes 224, 226, and 228 together form a composite power spike in the form of an oscillating wave with a power variation of over about 10% of the average power of the laser output pulse. The oscillating wave can last from about one-half cycle to three cycles of duration within the duration of the laser pulse power profile. The period of the oscillation cycle is preferably between about 1 ns and about 15 ns.

One preferred embodiment of amplifier 204 is a fiber laser amplifier. The length of the fiber, type of lasing dopant, doping level, and pumping level can be tailored to realize the required amplification gain. An exemplary laser 200 can be a modification of a fiber laser manufactured by IMRA, America, Inc., Fremont, Calif. and IPG Photonics Corp., Oxford, Mass. Both IMRA and IPG manufacture laser devices that include a fast laser diode operating as the injection laser followed by a fiber power amplifier. The laser wavelength is tunable in the 1.06 μm to 1.1 μm range. The laser pulse shape is substantially square shaped with a pulse width programmable from 5 ns to 20 ns, laser energy of 0.1 μJ to 10 μJ, and laser pulse repetition rate of about 20 KHz. With the tailoring of the drive current supply to the fast diode laser, the laser pulse power profile can be tailored as described for the present invention. Another exemplary fiber laser manufactured by INO, Quebec, Canada implements a special technique to get the injection laser pulse from the fiber itself and then use the fiber to amplify the injection pulse. Its currently available version works at a laser wavelength of 1.57 μm, and its pulse profile is very similar to that shown in FIG. 6F. According to INO, it is not difficult to make a similar laser working at wavelength of 1.06 μm to 1.1 μm with a different tailored laser pulse profile.

With reference to FIGS. 4, 5, and 6, the preferred laser wavelengths are in the spectral range from about 150 nm to about 2000 nm, and include, but are not limited to, 1.54, 1.3, 1.1-1.06, 1.05, 1.047, 1.03-0.75 μm or their second, third, fourth, or fifth harmonics from Nd:YAG, Nd:YLF, Nd:YVO$_4$, Yb:YAG, Ti:Sapphire, and fiber lasers with different base materials and doping. Skilled persons will appreciate that lasers emitting output pulses at other suitable wavelengths are commercially available and could be employed. Skilled persons will also appreciate that any of the second, third, or fourth harmonics of Nd:YAG (532 nm, 355 nm, 266 nm); Nd:YLF (524 nm, 349 nm, 262 nm); or the second harmonic of Ti:Sapphire (375 nm-425 nm) can be employed to preferably process certain types of links 22 and/or passivation layers 44 using appropriate well-known harmonic conversion techniques. Harmonic conversion processes are described in V. G. Dmitriev, et al., *Handbook of Nonlinear Optical Crystals*, 138-141, Springer-Verlag, New York, 1991 ISBN 3□540-53547-0.

Figure 7:
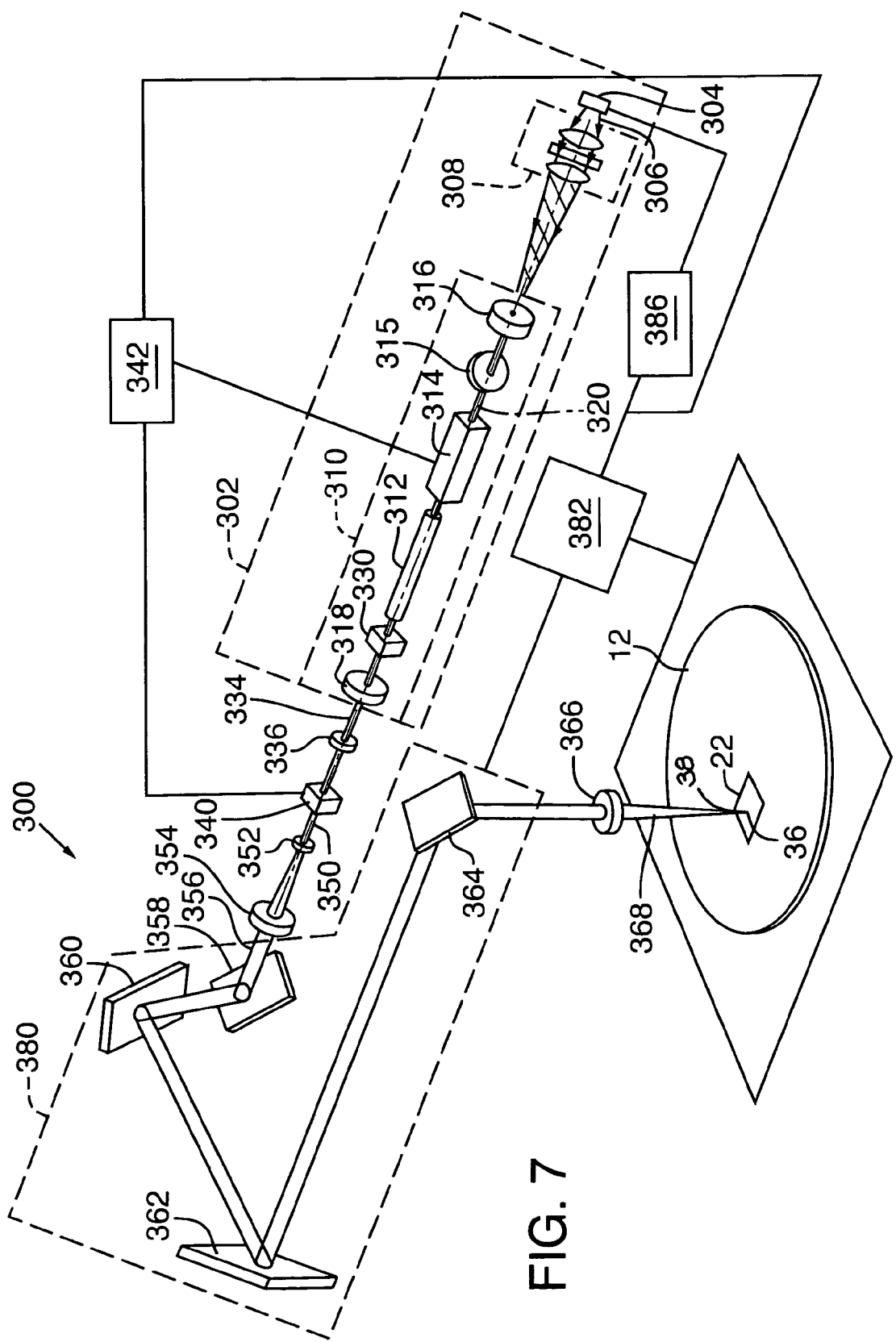
FIG. 7 is a partly schematic, simplified diagram of an embodiment of an exemplary system implemented with a diode-pumped, Q-switched Nd:YAG laser that is followed by an E-O gating device and a work piece positioner that cooperate with a laser processing control system for practicing the method of the present invention.

With reference to FIG. 7, laser system 300 is modeled herein only by way of example to a 1.064 μm Nd:YAG laser 302. The Nd:YAG or other solid-state laser 302 is preferably pumped by a laser diode 304, the emission 306 of which is focused by lens components 308 into a laser resonator 310. Laser resonator 310 preferably includes a lasant 312, a Q switch 314, and an optional polarizer 315 positioned between resonator mirrors 316 and 318 along an optic axis 320. An aperture 330 may also be positioned between lasant 312 and mirror 318. A laser output pulse 334 propagates along optic axis 320 through mirror 318, which functions as a partly reflective output coupler. In one embodiment of the invention, laser pulse 334 propagating from laser 302 is incident on an optional optical component or device 336, such as a waveplate, a polarizer, or an isolator, and then undergoes the special intensity profile tailoring with an E-O gating device 340, controlled by a subcontroller 342.

Regardless of wavelength or laser type, laser output 350 of gating device 340 can be manipulated by a variety of conventional optical components 352 and 354 that are positioned along a beam path 356. Components 352 and 354 may include a beam expander or other laser optical components to collimate laser output 350 to produce a beam with useful propagation characteristics. One or more beam reflecting mirrors 358, 360, 362, and 364 that are highly reflective at the laser wavelength desired, but highly transmissive at the unused wavelengths, are optionally employed so that only the desired laser wavelength will reach link structure 36. A focusing lens 366 preferably employs a single component or multicomponent lens system that focuses a collimated pulsed laser system output 368 to produce a focused spot size 40 that is greater than and thereby encompasses link width and is preferably less than 2 μm in diameter or smaller, depending on the link width 28 and the laser wavelength.

A preferred beam positioning system 380 composed of optical components 358, 360, 362, and 364 is described in detail in U.S. Pat. No. 4,532,402 of Overbeck for Method and Apparatus for Positioning a Focused Beam on an Integrated Circuit. Beam positioning system 380 preferably employs a laser controller 382 that controls at least two platforms or stages (stacked or split-axis) and coordinates with beam reflecting mirrors 358, 360, 362, and 364 to target and focus laser system output 368 to a selected conductive link 22 on IC device or work piece 12. Beam positioning system 380 permits quick movement between links 22 on work piece 12 to effect unique link-severing operations on-the-fly, based on provided test or design data.

The position data preferably direct the focused laser spot 38 over work piece 12 to target link structure 36 with one laser pulse of laser system output 368 to remove link 22. Laser system 300 preferably severs on-the-fly with a single laser pulse 37 each of links 22 to be severed. Laser system 300 accomplishes this process without stopping beam positioning system 380 over any link 22, so that high throughput is realized. Persons skilled in the art will appreciate that such laser systems 300 equipped with conventional diode pumped, Q-switched solid-state lasers are commercially available and well known to skilled practitioners.

Laser controller 382 is provided with instructions concerning the proper process of the selected links. Laser controller 382 may be influenced by timing data that synchronizes the firing of laser system 300 to the motion of the platforms such as described in U.S. Pat. No. 5,453,594 of Konecny for Radiation Beam Position and Emission Coordination System. Alternatively, in one embodiment of the present invention, skilled persons will appreciate that laser controller 382 is used for extracavity modulation of laser energy by an E-O device 340 and instructs subcontrollers 342 and 386 that control Q-switch 314, E-O device 340, and pumping diode 304.

Figure 1:
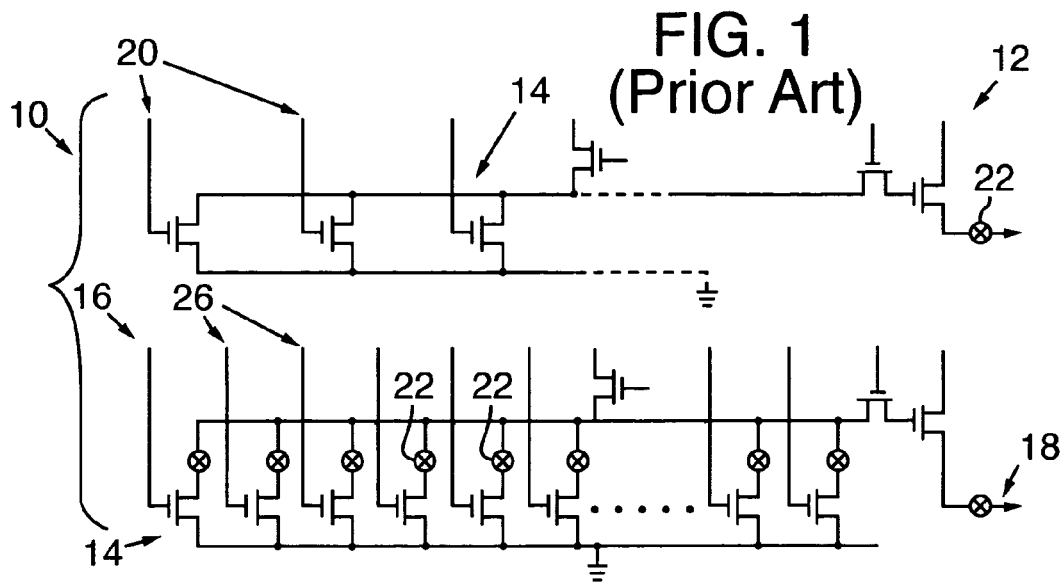
FIG. 1 is a schematic diagram of a portion of a prior art DRAM showing the redundant layout of and programmable links in a spare row of generic circuit cells.
Figure 2A:
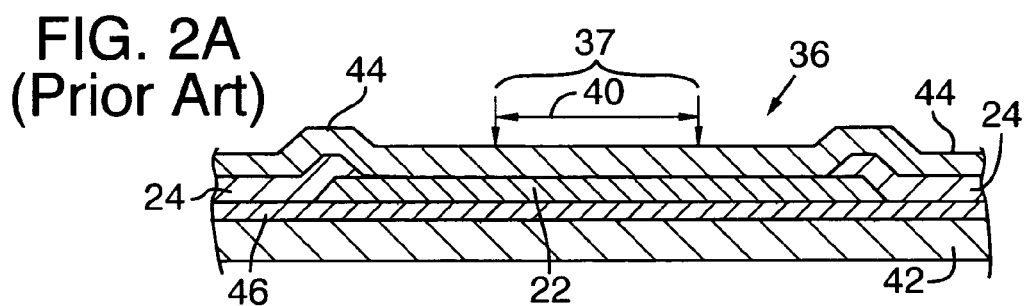
FIG. 2A is a fragmentary cross-sectional side view of a conventional, large semiconductor link structure receiving a laser pulse characterized by a prior art pulse parameters.
Figure 2B:
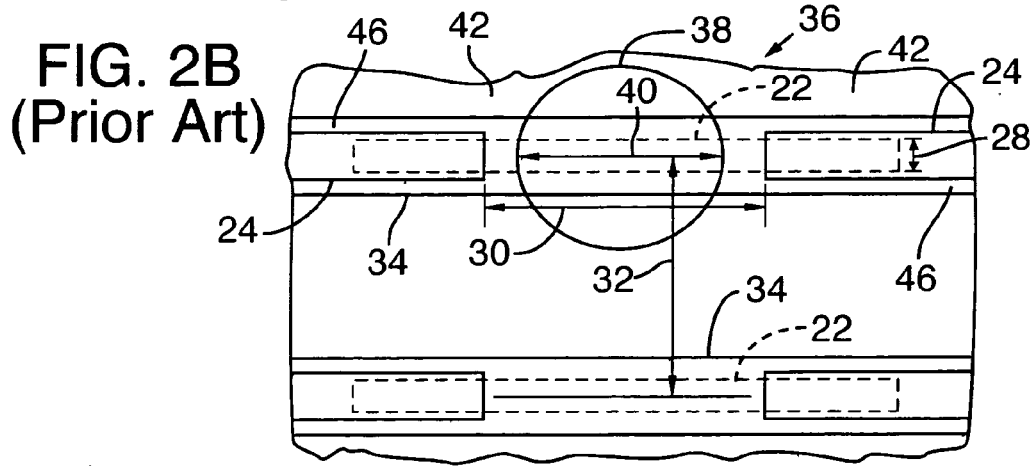
FIG. 2B is a fragmentary top view of the link structure and the laser pulse of FIG. 2A, together with an adjacent circuit structure.
Figure 2D:
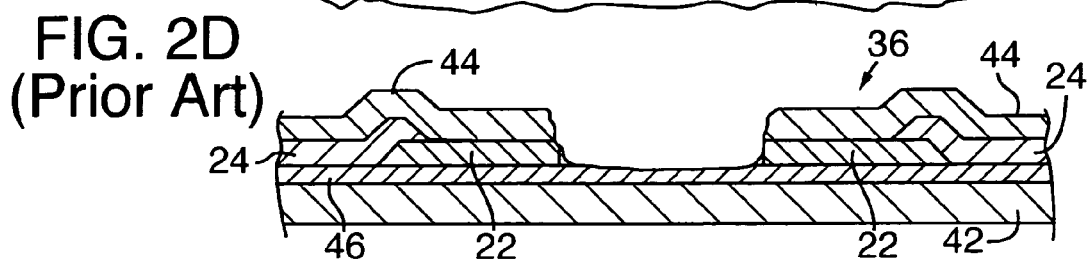
FIG. 2D is a fragmentary cross-sectional side view of the link structure of FIG. 2B after link removal by application of the prior art laser pulse.
Figure 2C:
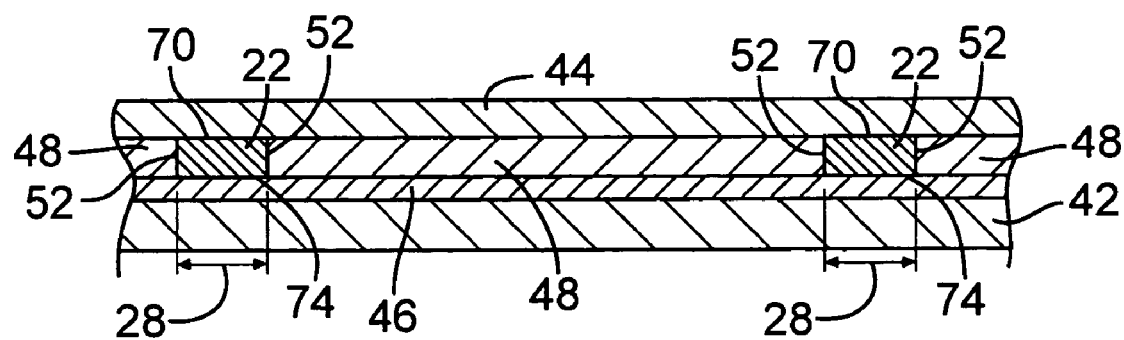
FIG. 2C is a fragmentary cross-sectional end view of the link structure of FIG. 2B showing the width dimensions of two adjacent links and the passivation layer stack associated with them.

With reference to FIGS. 2A-2C, in view of the foregoing, link processing with laser pulse 37 of a specially tailored power profile offers a wider processing window and a superior quality of severed links than does link processing with a laser pulse of conventional power profile. The overshoot at the beginning of the laser pulse and/or spike properly timed within the duration time of the laser pulse ensures that an adequate amount of laser energy is coupled into the link structure within a proper time period before all the link material of the selected link is removed. This is accomplished with adequate processing margin for the inevitable variations of the link structure and the laser parameters themselves. After most of the link material is removed by the laser energy, the laser pulse power is specially tailored to have much lower value compared to the peak power of the laser pulse, or the power of the overshoot and spike. Thus, this specially tailored laser pulse power profile ensures less risk of damage to the neighboring structures and silicon substrate 42. In addition to conventional link blowing IR laser wavelengths, laser wavelengths shorter than the IR wavelengths can also be used for the process with the added advantage of smaller laser beam spot size, even though the absorption of a silicon wafer at the shorter laser wavelengths is higher than that at the conventional IR wavelengths. Thus, the processing of narrower and denser links is facilitated. This better link removal resolution permits links 22 to be positioned closer together, thereby increasing circuit density. Although link structures 36 can have conventional sizes, the link width 28 can, for example, be less than or equal to about 0.5 µm.

Similarly, the versatility of better tailoring the laser pulse power profile offers better flexibility in accommodating different passivation characteristics. Passivation layers 44 above or passivation layers 46 below links 22 can be made with material other than the traditional materials or can be modified, if desired to be other than a typical height. This is so because the laser pulse can be tailored, thereby reducing the risk of damage to the underlying or neighboring passivation structure. In addition, wavelengths that are much shorter than about 1.06 µm can be employed to produce critical spot size diameters 40 of less than about 2 µm center-to-center pitch 32 between links 22. Links processed with laser pulses from shorter wavelength lasers can, therefore, have a substantially smaller center-to-center pitch 32 than that possible for links blown by a conventional IR laser beam-severing pulse. Link 22 can, for example, be within a distance of 2.0 µm or less from other links 22 or adjacent circuit structures 34.

Overlying passivation layer 44 may include any conventional passivation materials such as silicon dioxide ($SiO_2$) and silicon nitride ($Si_3N_4$). Underlying passivation layer 46 may include the same passivation material as or different passivation material(s) from overlying passivation layer 44. In particular, underlying passivation layer 46 in target structures 36 may comprise fragile materials, including but not limited to, materials formed from low K materials, low K dielectric materials, low K oxide-based dielectric materials, orthosilicate glasses (OSGs), fluorosilicate glasses, organosilicate glasses, tetraethylorthosilicate (TEOS)-based oxides, methyltriethoxyorthosilicate (MTEOS), propylene glycol monomethyl ether acetate (PGMEA), silicate esters, hydrogen silsesquioxane (HSQ), methyl silsesquioxane (MSQ), polyarylene ethers, benzocyclobutene (BCB), SiCOH, or SiCOH-derived film (such as "Black Diamond" sold by Applied Materials, Inc.), or spin on-based low K dielectric polymer (such as "SiLK" sold by Dow Chemical Company). Underlying passivation layers 46 made from some of these materials are more prone to crack when their targeted links 22 are blown or ablated by conventional single laser-pulse link-removal operations. Skilled persons will appreciate that $SiO_2$, SiON, $Si_3N_4$, low K materials, low K dielectric materials, low K oxide-based dielectric materials, OSGs, fluorosilicate glasses, organosilicate glasses, HSQ, MSQ, BCB, SiLK™, and Black Diamond™ are actual layer materials, and TEOS, MTEOS, and polyarylene ethers are semiconductor condensate precursor materials.

It will be obvious to those having skill in the art that many changes may be made to the details of the above-described embodiments without departing from the underlying principles of this invention. The scope of the present invention should, therefore, be determined only by the following claims.

The invention claimed is:

1. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivatian structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width;

the laser pulse rernpoial power profile having rising and falling edges, having a pulse duration, and characterized by a power spike, the power spike having a spike duration that is substantially shorter than the pulse duration, a peak power that is more than about 10% over the average power of the laser output pulse, and a time of occurrence that is coincident with the rising edge;

the laser pulse temporal power profile, after the coincidence of the occurrence of the power spike and the rising edge, declining to and holding relatively steady at a level for a time before the falling edge; and the peak power, spike duration, and time of occurrence of the power spike cooperating to establish for the laser output pulse a specially tailored laser pulse power profile that effects severing of the selected link structure while not causing appreciable damage to the substrate or the passivation structure material positioned adjacent the side and bottom surfaces.

2. The laser processing method of claim 1, in which the pulse duration is shorter than about 40 ns.

3. The laser processing method of claim 1, in which the power spike has a rise time and in which the rise time is shorter than about 5 ns.

4. The laser processing method of claim 3, in which the rise time is shorter than about 2 ns.

5. The laser processing method of claim 1, in which the spike duration is between about 1 ns and about 50% of the pulse duration of the laser pulse temporal power profile.

6. The laser processing method of claim 1, in which the adjacent passivation structure material overlays the electrically conductive links to form an overlying passivation layer.

7. The laser processing method of claim 1, in which the adjacent passivation structure material is positioned so that it does not overlay the electrically conductive links.

8. The laser processing method of claim 1, in which the falling edge of the laser pulse temporal power profile is tailored to have duration shorter than about 10 ns.

9. The laser processing method of claim 1, in which the selected electrically conductive link structure comprises aluminum, chromide, copper, polysilicon, disilicide, gold nickel, nickel chromide, platinum, polycide, tantalum nitride, titanium, titanium nitride, tungsten, or tungsten silicide.

10. The laser processing method of claim 1, in which each laser output pulse has laser energy of between about 0.001 microjoule and about 10 microjoule.

11. The method of claim 1, in which the adjacent passivation structure material, underlying passivation layer, or both of them, comprise one or more of $SiO_2$, $Si_3N_4$, SiON, a low K material, a low IC dielectric material, a low K oxide-based dielectric material, an orthosilicate glass, a fluorosilicate glass, an organosilicate glass, a tetraethylorchosilicate-based oxide, methyltriethoxyorthosilicate, propylene glycol monomechyl ether acetate, a silicate ester, hydrogen silsesquioxane, methyl silsesquioxane, a polyarylene ether, benzocyclobutene, a SiCOH or SiCOH-derived film, or spin on-based low K dielectric polymer.

12. The method of claim 1, in which at least two laser output pulses are generated for removing target material aligned with locations of respective selected electrically conductive link structures at a repetition rate of greater than about 10 KHz.

13. The laser processing method of claim 1, in which the laser output pulse is of a wavelength in a spectral range from about 150 nm to about 2000 nm.

14. The laser processing method of claim 13, in which the wavelength of the laser output pulse is one of a fundamental, second harmonic, or third harmonic wavelength emitted from a YAG, YLF, $YVO_4$, sapphire, or fiber laser.

15. The laser processing method of claim 13, in which the laser output pulse is emitted by a fiber laser at a wavelength of about 1.06 μm or its second or third harmonic wavelength, 1.3 μm or its second or third harmonic wavelength, or 1.5 μm or its second or third harmonic wavelength.

16. The method of claim 1, in which the wavelength of the laser output pulse is about one of the following wavelengths or within one of the following wavelength ranges; 1.54 μm, 1.3 μm, 1.1-1.06 μm, 1.05 μm, 1.047 μm, 1.03 -0.75 μm, 0.65 μm, 0.53 μm, 0.5 μm, 0.43 μm, 0.35 μm, or 0.27 μm.

17. The method of claim 15, in which the link has a thickness of greater than 0.3 μm.

18. The method of claim 1, in which the link has a thickness of greater than 0.3 μm.

19. The method of claim 1, in which the laser output pulse is characterized by a wavelength and in which the adjacent passivation structure material, the substrate, or both of them are significantly absorbent to the wavelength.

20. The method of claim 19, in which the wavelength comprises a UV wavelength.

21. The method of claim 20, in which the link has a thickness of greater than 0.3 μm.

22. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivation structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width;

the laser pulse temporal power profile having rising and falling edges, having a pulse duration, and characterized by a power spike, the power spike having a spike duration that is substantially shorter than the pulse duration, being coincident with the rising edge of the laser pulse temporal power profile, and having a peak power value that is more than about 10% over the average power of the laser output pulse;

the laser pulse temporal power profile, after the coincidence of the occurrence of the power spike and the rising edge, decreasing substantially exponentially with time to the falling edge; and the peak power, spike duration, and time of occurrence of the power spike set at values cooperating to cause the power spike to function as a working pulse portion that rapidly couples sufficient energy into the selected link structure to establish for the laser output pulse a specially tailored laser pulse power profile that effects severing of the selected link structure while not causing appreciable damage to the substrate or the passivation structure material positioned adjacent the side and bottom surfaces.

23. The laser processing method of claim 22, in which the total decrease in power after the occurrence of the power spike is more than about 10% of the average power of the laser output pulse.

24. The laser processing method of claim 22, in which the power spike has a rise time and in which the rise time is shorter than about 5 ns.

25. The laser processing method of claim 24, in which the rise time is shorter than about 2 ns.

26. The laser processing method of claim 22, in which the laser output pulse is of a wavelength in a spectral range from about 150 nm to about 2000 nm.

27. The laser processing method of claim 26, in which the wavelength of the laser output pulse is one of a fundamental, second harmonic, or third harmonic wavelength emitted from a YAG, YLF, $YVO_4$, sapphire, or fiber laser.

28. The laser processing method of claim 26, in which the laser output pulse is emitted by a fiber laser at a wavelength of about 1.06 μm or its second or third harmonic wavelength, 1.3 μm or its second or third harmonic wavelength, or 1.5 μm or its second or third harmonic wavelength.

29. The method of claim 22, in which the wavelength of the laser output pulse is about one of the following wavelengths or within one of the following wavelength ranges: 1.54 μm, 1.3 μm, 1.1-1.06 μm, 1.05 μm, 1.047 μm, 1.03-0.75 μm, 0.65 μm, 0.53 μm, 0.5 μm, 0.43 μm, 0.35 μm, or 0.27 μm.

30. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivation structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width;

the laser pulse temporal power profile having rising and falling edges, having a pulse duration, and characterized by a power spike, the power spike having a spike duration that is substantially shorter than the pulse duration, a peak power that is greater than the average power of the laser output pulse, and a time of occurrence within an interval measured from the rising edge to 70% of the pulse duration of the laser pulse temporal power profile;

the laser pulse temporal power profile having a shape that is not flat between the rising edge and the power spike and between the falling edge and the peak power of the power spike; and the peak power, spike duration, and time of occurrence of the power spike set at values cooperating to cause the power spike to function as a working pulse portion that rapidly couples sufficient energy into the selected link structure to establish for the laser output pulse a specially tailored laser pulse power profile that effects severing of the selected link structure while not causing appreciable damage to the substrate or the passivation structure material positioned adjacent the side and bottom surfaces.

31. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivation structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width;

the laser pulse temporal power profile having rising and falling edges, having a pulse duration, and characterized by a power spike in a form of an oscillating wave with a power variation of over about 10% of the average power of the laser output pulse, the power spike having a spike duration, a peak power that is greater than the average power of the laser output pulse, and a time of occurrence of the oscillating wave encompassed by the rising edge and the falling edge; and the peak power, spike duration, and time of occurrence of the power spike cooperating to establish for the laser output pulse a specially tailored laser pulse power profile that effects severing of the selected link structure while not causing appreciable damage to the substrate or the passivation structure material positioned adjacent the side and bottom surfaces.

32. The laser processing method of claim 31, in which the oscillating wave includes multiple cycles of oscillation within the pulse duration of the laser pulse temporal power profile, and the period of each oscillation cycle of the oscillating wave is between about 1 ns and about 15 ns.

33. The laser processing method of claim 31, in which the oscillating wave includes multiple cycles of oscillation within the pulse duration of the laser pulse temporal power profile, the multiple cycles of oscillation have times of occurrence, and successive ones of the multiple cycles decrease in peak power with increasing times of occurrence measured from the rising edge.

34. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivation structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width; and the laser pulse temporal power profile having rising and falling edges, having a pulse duration, and characterized by first and second power spikes, the first power spike having a spike duration that is substantially shorter than the pulse duration, a peak power that is greater than the average power of the laser output pulse, and a time of occurrence that is coincident with the rising edge, and the second power spike having a spike duration of between about 1 ns and about 30% of the pulse duration, a peak power that is more than 5% over the average power of the laser output pulse, and a time of occurrence encompassed by the first power spike and the falling edge; and the peak powers, spike durations, and times of occurrence of the first and second power spikes cooperating to establish for the laser output pulse a specially tailored laser pulse power profile that effects severing of the selected link structure while not causing appreciable damage to the substrate or the passivation structure material positioned adjacent the side and bottom surfaces.

35. A laser-based processing method of removing target material from selected electrically conductive link structures of redundant memory or integrated circuitry, each selected link structure including a link having opposite side surfaces and top and bottom surfaces, the opposite side surfaces being separated by a distance that defines a link width, at least the side and bottom surfaces being positioned adjacent passivation structure material in a circuit fabricated on a substrate, comprising:

directing a laser output pulse for incidence on a selected link structure, the laser output pulse being in the form of a unitary pulse characterized by a laser spot, an average power, and a laser pulse temporal power profile;

the laser spot having a spot size at a laser spot position on the selected link structure, the spot size being larger than the link width;

the laser pulse temporal power profile having rising and falling edges, having a pulse duration, and characterized by a power spike, the power spike having a spike duration that is substantially shorter than the pulse duration, a peak power that is greater than the average power of the laser output pulse, and a time of occurrence from the rising edge to the falling edge and within an interval measured from the rising edge to 70% of the pulse duration of the laser pulse temporal power profile;

the laser pulse temporal power profile, after the rising edge, declining to and holding relatively steady at a level for a time before the falling edge; and the peak power, spike duration, and time of occurrence of the power spike set at values cooperating to cause the power spike to function as a working pulse portion that rapidly couples sufficient energy into the selected link structure to establish for the laser output pulse a specially tailored laser pulse power profile that effects severing of the selected link structure while not causing appreciable damage to the substrate or the passivation structure material positioned adjacent the side and bottom surfaces.

36. The laser processing method of claim 35, in which the laser pulse temporal power profile holds relatively steady for a time before and for a time after the power spike.

37. The laser processing method of claim 35, in which the power spike has a peak power that is over 10% of the average power of the laser output pulse and has a spike duration that is between 1 ns and 50% of the laser pulse temporal power profile.

* * * * *